United States Patent
Bao et al.

(10) Patent No.: US 7,057,205 B2
(45) Date of Patent: Jun. 6, 2006

(54) P-TYPE OFET WITH FLUORINATED CHANNELS

(75) Inventors: Zhenan Bao, Stanford, CA (US); Evert-Jan Borkent, Groningen (NL)

(73) Assignee: Lucent Technologies Inc., Murray Hill, NJ (US)

( * ) Notice: Subject to any disclaimer, the term of this patent is extended or adjusted under 35 U.S.C. 154(b) by 212 days.

(21) Appl. No.: 10/802,973

(22) Filed: Mar. 17, 2004

(65) Prior Publication Data

US 2005/0205861 A1 Sep. 22, 2005

(51) Int. Cl.
  *H01L 29/08* (2006.01)
  *H01L 35/24* (2006.01)
  *H01L 51/00* (2006.01)

(52) U.S. Cl. .......................... 257/40; 257/410; 257/411

(58) Field of Classification Search .................. 257/40, 257/410, 411
  See application file for complete search history.

(56) References Cited

U.S. PATENT DOCUMENTS

| | | | |
|---|---|---|---|
| 6,383,665 B1 * | 5/2002 | Bao et al. ................... | 428/690 |
| 6,585,914 B1 | 7/2003 | Marks et al. | |
| 6,608,323 B1 | 8/2003 | Marks et al. | |
| 6,824,706 B1 * | 11/2004 | Heeney et al. ......... | 252/299.01 |
| 2002/0171125 A1 * | 11/2002 | Bao et al. ................... | 257/642 |
| 2003/0168657 A1 * | 9/2003 | Farrand et al. ................ | 257/40 |
| 2004/0001778 A1 * | 1/2004 | Chen et al. ................... | 422/88 |
| 2004/0004515 A1 * | 1/2004 | Iechi et al. ................... | 257/40 |
| 2004/0175638 A1 * | 9/2004 | Tierney et al. ................ | 430/75 |
| 2004/0186266 A1 | 9/2004 | Lu et al. | |

FOREIGN PATENT DOCUMENTS

WO  WO 03/010778  2/2003

OTHER PUBLICATIONS

Büchner, et al. "Poly (fluorinated 3-alkyl thiophene)" Journal of Electroanalytical Chemistry, vol. 277, Jan. 10, 1990, pp. 355-358, XP002321101 Elsevier Lausanne Switzerland.
Robitaille, et al. "Synthesis, Characterization, and Langmuir-Blodgett Films of Fluorinated Polythiophenes" Macromolecules, American Chemical Society, Easton U.S., vol. 27, No. 7, Mar. 28, 1994, pp. 1847-1851; XP000433198, ISSN: 0024-9297.
Xiaoyong Hong, et al.; "Synthesis and Oxidative Polymerization of Semifluoroalkyl-Substituted Thiophenes"; 1999 American Chemical Society, Macromolecules 1999, vol. 32; pp. 4232-4239.
Antonio Facchetti, et al.; "n-Type Building Blocks for Organic Electronics: A Homologous Family of Fluorocarbon-Substituted Thiophene Oligomers With High Carrier Mobility"; Advanced Matter 2003, vol. 15, No. 1, Jan. 3; pp. 33-38.

* cited by examiner

*Primary Examiner*—David Zarneke
*Assistant Examiner*—Igwe U. Anya

(57) ABSTRACT

The present invention provides an organic field-effect transistor (OFET) and a method of fabricating the OFET. The OFET, configured to function as a p-type semiconductor, includes a substrate having a top surface and a semiconductor layer located over the top surface. The semiconductor layer comprises organic semiconductor molecules. Each of the organic semiconductor molecules includes a core having conjugated pi bonds, a fluorinated alkyl group, and an alkyl spacer group having a chain of two or more carbon atoms. One end of the chain is bonded to the fluorinated alkyl group and another end of the chain is bonded to the core. Substituents coupled to the carbon atoms have an electronegativity of less than about 4.

13 Claims, 6 Drawing Sheets

P-TYPE OFET WITH FLUORINATED CHANNELS

The U.S. Government has a paid-up license in this invention and the right in limited circumstances to require the patent owner to license others on reasonable terms as provided for by the terms of Advanced Technology Program Cooperative Agreement No. 70NANB2H3032 awarded by the National Institute of Standards and Technology.

TECHNICAL FIELD OF THE INVENTION

The present invention is directed, in general, to a method of manufacturing organic field effect transistors (OFETs).

BACKGROUND OF THE INVENTION

There is growing interest in the use of OFETs, where an active channel of the transistor is made from an organic semiconductive material. The organic semiconductive material should be capable of supporting, under a broad range of. environmental conditions, a channel of holes or electrons when the device is switched on. Ideally, the mobility of carriers in the channel is resistant to the environmental effects of elevated humidity.

Unfortunately, the performance of conventional p-type organic semiconductive materials is highly sensitive to moisture. Consequently, the mobility of holes in conventional p-type OFETs rapidly decreases with increased humidity. Previous attempts to reduce moisture sensitivity includes placing an encapsulating barrier layer over the semiconductor molecules. The use of a barrier layer, however, increases the expense and complexity to fabricate the OFET. Moreover, a barrier layer may not be desirable in applications where the organic semiconductor material serves as a sensor for the detection of target organic species in air or aqueous media.

The present invention overcomes the disadvantages associated with prior art devices by providing an OFET having a p-type channel composed of fluorinated organic semiconductor molecules with reduced sensitivity towards moisture, and a method for the fabrication of such a device.

SUMMARY OF THE INVENTION

The present invention benefits from the realization that the moisture sensitivity of OFETs can be reduced through the use of a semiconductor layer having fluorinated organic semiconductor molecules. The molecules are configured such that the mobility of holes through the organic semiconductor molecules is unaffected by the presence of the fluorine atoms. Hole mobility is preserved by including spacer groups between the fluorine atoms and the core of conjugated Pi bonds of the organic semiconductor molecules. This, in turn, allows the manufacture of OFETs having higher moisture resistance.

One embodiment of the present invention provides an OFET. The OFET is configured to function as a p-type OFET. The OFET comprises a substrate having a top surface and a semiconductor layer located over the top surface. The semiconductor layer comprises organic semiconductor molecules. Each of the organic semiconductor molecules includes a core having conjugated pi bonds, a fluorinated alkyl group, and an alkyl spacer group having a chain of two or more carbon atoms. One end of the chain is bonded to the fluorinated alkyl group and another end of the chain is bonded to the core. Substituents coupled to the carbon atoms have an electronegativity of less than about 4.

In another embodiment, the invention further provides a method of manufacturing an OFET configured to function as a p-type semiconductor. The method includes providing a substrate, forming a gate over the substrate. A semiconductor layer, comprising the above-described organic semiconductor molecules, is formed over the substrate.

BRIEF DESCRIPTION OF THE DRAWINGS

The invention is best understood from the following detailed description, when read with the accompanying FIGUREs. Various features may not be drawn to scale and may be arbitrarily increased or reduced for clarity of discussion. Reference is now made to the following descriptions taken in conjunction with the accompanying drawings, in which.

DETAILED DESCRIPTION

The present invention recognizes for the first time, the advantageous use of fluorinated organic semiconductor molecules to provide a moisture-resistance p-type channel in an OFET. This recognition benefited from an extensive investigation of the moisture sensitivity of OFETs having channels composed of a broad range of different p-type and n-type semiconductor materials. It has been found that the moisture resistance of certain channels composed of n-type organic semiconductor molecules is due to the presence of fluorine substituents in these molecules.

The use of fluorine-substituted organic semiconductor molecules in a p-type channel is counterintuitive because fluorine substitution typically causes an otherwise p-type organic semiconductor molecule to become an n-type semiconductor. It is thought that the electron withdrawing properties of fluorine lower the energy levels of the lowest unoccupied molecular orbital (LUMO) and highest occupied molecular orbital (HOMO) of the conjugated system of pi bond in the semiconductor molecule. This, in turn, makes it easier for the LUMO level to accept electrons and therefore become a majority electron carrier instead of a majority hole carrier. Therefore one would expect the beneficial moisture resistance effect conferred by fluorine substitution of an organic semiconductor molecule to be offset by the deleterious effect of the molecule losing p-type characteristics.

The present invention resolves this obstacle through the design of a novel fluorine-substituted p-type organic semiconductor molecule. A spacer group in the molecule separates a fluorinated alkyl group from a core comprising the conjugated system of pi bonds. The spacer group is composed of an alkyl chain having two or more carbon atoms without substituents having a high electronegativity being directly bonded to the carbon atoms. While not limiting the scope of the invention, it is believed that the location of the alkyl chain of the spacer group between the fluorinated alkyl group and the core preserves the p-type characteristics of the organic semiconductor molecule. That is, the spacer group dampens the electron withdrawing inductive effect that the fluorine atoms would otherwise have on the core. The fluorinated alkyl groups, however, still impart moisture resistance to a channel composed of the organic semiconductor molecules.

Figure 1:
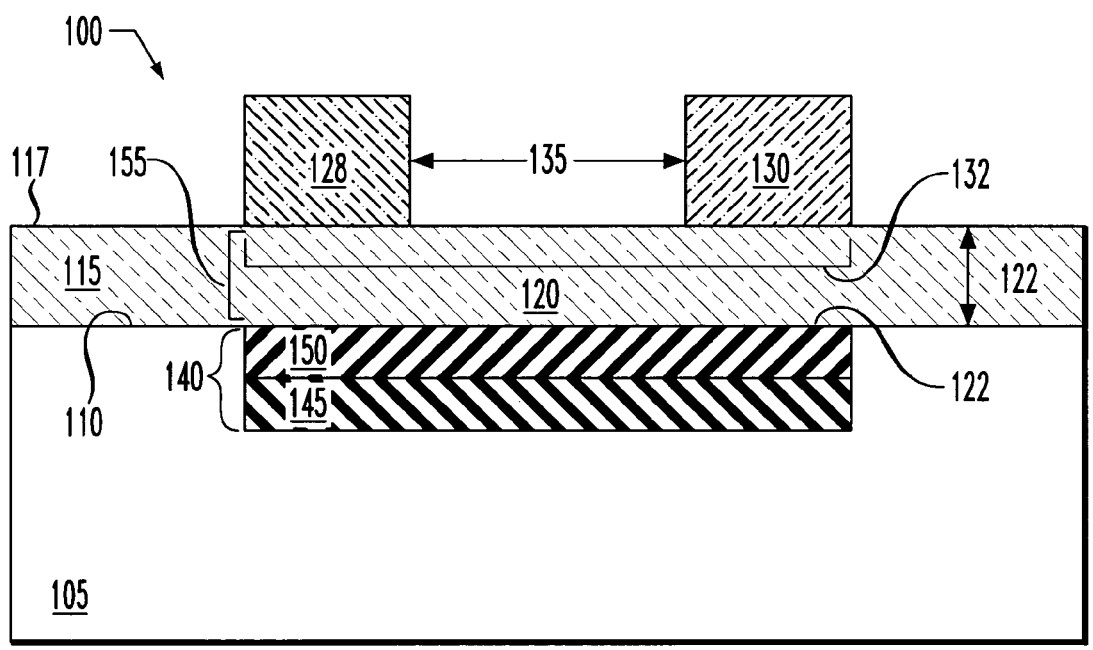
FIG. 1 illustrates a detailed sectional view of a top contact organic field effect transistor embodying the principles of the present invention.

FIG. 1 illustrates a cross sectional view of a portion of an exemplary OFET 100 that embodies the principles of the present invention. The OFET 100, configured to function as a p-type semiconductor, can be used in any number of applications, such as biosensors, integrated circuits, displays and memory devices.

The OFET 100 includes a substrate 105 having a top surface 110. The substrate 105 preferably comprises a plastic, although other conventional materials, such as silicon can be used. Examples of suitable plastics include polyester, polyimide, or polyamide.

The OFET 100 further includes a semiconductor layer 115 on the top surface 110 of the substrate 105. The semiconductor layer 115 comprises organic semiconductor molecules. Each organic semiconductor molecules has a core having conjugated pi bonds and at least one fluorinated alkyl group. The organic semiconductor molecules also have at least one an alkyl spacer group, having a chain of two or more carbon atoms. One end of the chain is bonded to the fluorinated alkyl group and another end of the chain is bonded to the core.

The alkyl spacer group can have substituents coupled to the carbon atoms of the chain, provided those substituents have an electronegativity of less than about 4. Electronegativity is as defined in THE NATURE OF THE CHEMICAL BOND, Linus Pauling, incorporated by reference herein in its entirety. Electronegativity values are expressed here using the Pauling scale, although other analogous scales could be used. One of ordinary skill in the art would understand how to determine or calculate the electronegativity value for both atoms and organic substituent groups.

Substituents having the above-described electronegativity, do not substantially decrease the mobility of the majority carrier, e.g., holes, through the core. The absence of strongly electron-withdrawing substituents on the carbon atoms ensures that there are no substantial electron-withdrawing inductive effects on the core. An example of an unsuitable substituent is fluorine, which has an electronegativity of about 4. In some cases however, it is preferable to use substituents having an electronegativity of less than about 3.5, because such groups may still have enough electron withdrawing ability to allow electron injection into the semiconductor. Examples of unsuitable substituents in this category include cyano (—CN) and oxygen (forming —C═O with carbon). In still other cases, to further avoid decreases in carrier mobility, it is preferable to use substituents having an electronegativity of less than about 3. Examples of unsuitable substituents in this category include chlorine.

One class of suitable fluorinated alkyl groups are linear alkyl groups, as represented by the formula: $C_nH_{2n+1-m}F_m$. The number of carbon atoms, n, is preferably between 1 and 18. The number of fluorine atoms bonded to the carbon atoms, m, is between 1 and 2n+1 (e.g., alkyl chain ranging from monofluorinated, when m=1, to perfluorinated, when m=2n+1). Examples of preferred fluorinated linear alkyl groups include perfluoroheptyl ($C_7F_{15}$) and perfluoropropyl ($C_3F_7$). Alternatively, other classes fluorinated alkyl groups, such as branched alkyls or cycloalkyls can be used.

As noted above, the spacer group is an alkyl group having a chain of two or more carbon atoms that prevents the fluorinated alkyl group from having a detrimental electron-withdrawing inductive effect on the core. Preferably, the number of carbon atoms in the spacer group is between 2 and 18. Any of the above-described classes of linear, branched or cylcoalkyl groups are also suitable for use as a spacer group as well, provided that the alkyl group does not contain substituents having substantial electron-withdrawing properties, as discussed above. For example, in some preferred embodiments, the spacer group is non-fluorinated, or non-halogenated.

The core has a conjugated pi system, as exemplified by oligothiophenes such as alpha-sexithiophene. Preferably, the organic semiconductor molecules of the semiconductor layer 115 has an ordered crystalline or polycrystalline structure. For the purposes of the present invention, an oligothiophene has between 2 and 100 repeating units of thiophene. Other compounds, however, are also within the scope of the present invention. Nonlimiting examples include oligophenyl compounds or combinations of different benzoid aromatic ring structures like benzene, napthalene or anthracene rings coupled to each other in a conjugated structure. Additional examples include pentacene, nonbenzoid aromatic rings, heterocylic rings, such as thiophene, or co-oligomers of these structures, such as co-oligo(bithiophenefluorene), co-oligo(bithiopheneanthracene). Another example is phthalocyanine.

Some preferred organic semiconductor molecules of the semiconductor layer 115 have a core with substantially coplanar aromatic groups, as this facilitates a denser and more uniform packing of the molecules. A dense and uniform packing, in turn, improves the carrier mobility of the channel in the semiconductor layer 115. The term substantially coplanar aromatic groups refers to at least two adjacent aromatic groups in an organic semiconductor molecule having a twist angle of less than about 23 degrees between aromatic groups. For example, adjacent thiophene rings in alpha-sexithiophene have a twist angle of about 10 degrees, and therefore the thiophene rings are considered to be substantially coplanar. In contrast, the two linked benzene rings in a biphenyl structure have a twist angle of about 23 degrees, and therefore the benzene rings are not coplanar.

In some preferred embodiments, the organic semiconducting molecules of the semiconductor layer 115 have a core comprising linear organic groups because this facilitates denser and more uniform packing of the organic semiconductor molecules. Examples of linear organic groups include oligothiophenes such as alpha-sexithiophene, as shown below:

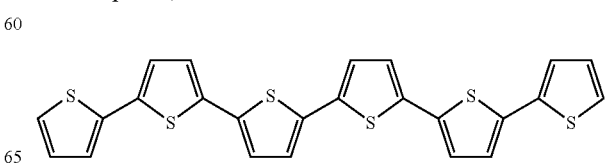

Other examples of linear organic groups include derivatives of thiophenes, such as co-oligo(bithiophenefluorene) such as shown below:

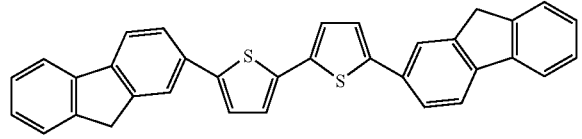

In other embodiments, the organic groups of the core can have sidechains, such as oligothiophenes with an alkyl chain substituted at the 3-positions of one or more thiophenes, such as shown below:

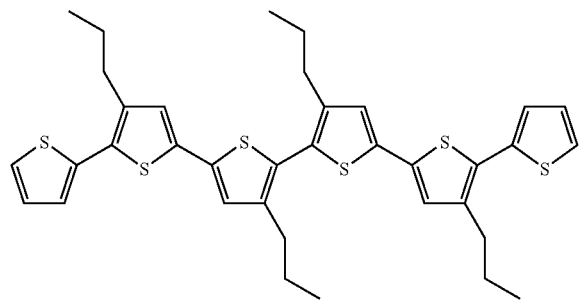

In some embodiments, it is advantageous for the organic semiconducting molecule to have at least two of non-fluorinated alkyl spacer groups connected to ends of the core. In such configurations, one end of the chain of the spacer group is connected to the fluorinated alkyl group and the other end of the chain is connected to the core. Examples of such organic semiconducting molecules can be represented by the formula as shown below:

CR corresponds to the core, FAG1 and FAG2 correspond to first and second fluorinated alkyl groups, respectively, and SG1 and SG2 correspond to first and second spacer groups, respectively. FAG1 can be the same or different from FAG2, as can SG1 be the same or different from SG2. Examples of suitable organic semiconductor molecules include 5,5'''''-bis(4,4,5,5,6,6,7,7,8,8,8 undecafluoro-octyl)alpha-sexithiophene and 5,5'''''-bis(4,4,5,5,6,6,6 heptafluoro-hexyl)alpha-sexithiophene.

More than two fluorinated alkyl group-spacer group pairs can be connected to the core. Using abbreviations analogous to that used above to represent the core, fluorinated alkyl groups, and spacer groups, an example of such an organic semiconducting molecule is shown below:

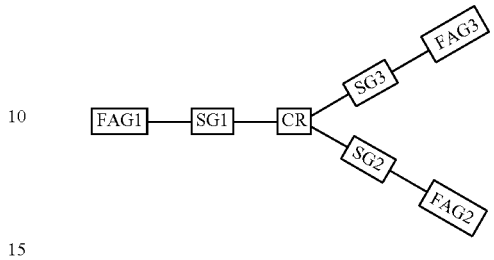

Additionally, the fluorinated alkyl group can be connected to an internal carbon atom of the spacer group, but not the carbon atom that is bonded directly to the core, such as represented below:

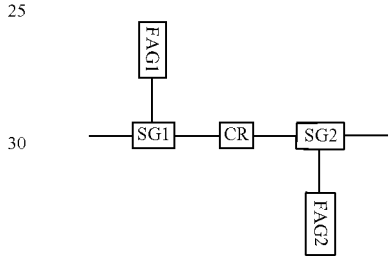

Similarly, one or more of the spacer groups and fluorinated alkyl group can be connected to an inner aromatic ring of the core, such as represented below:

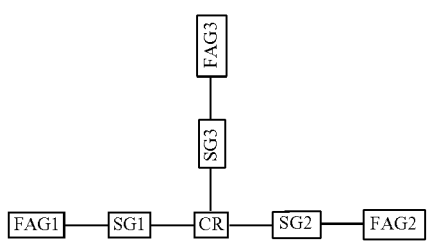

Preferred locations of fluoro-alkyl substitution relative to the core depend on the size and orientation of the organic semiconductor molecules. For instance, it is preferable for the organic semiconductor molecules to be configured such that a substantial number of the fluoro-alkyl groups between the core and the environment surrounding the semiconductor layer 115. For shorter oligomers, having between about 2 and about 10 repeating units, fluoro-alkyl substituents preferably are on the first or last thiophene ring. Terminal substitutions of such groups are preferred because the longer axis of the core in short oligomers tends to be normal to the substrate surface 115. Thus, the fluorine atoms at one end of shorter oligomers will be at or near the top surface of the semiconductor layer 117. Additionally, in such embodiments, fluoro-alkyl substituted organic semiconductor molecules can advantageously prevent deleterious moisture penetration through water permeable substrate 105 and into the core of the organic semiconductor molecules.

In contrast, the longer axis of the core for long oligomers tend to lay parallel to the substrate surface 115. Therefore, better moisture protection is afforded by fluoro-alkyl substituents located on each, or every other, aromatic ring of the core. For example, for longer oligomers, having greater than about 10 repeating units, a preferred substitution for the fluoro-alkyl group is at the 3-position of the thiophene ring, with every, or every other thiophene ring being substituted.

The use of a low molecular weight organic semiconductor molecule is conducive to the advantageous use of vacuum deposition procedures for forming the semiconductor layer 115, as further discussed below. Some preferred organic semiconductor molecules have a molecular weight of 2000 grams/mole or less. To keep the molecular weight of the organic semiconductor molecules low, the core preferably has ten or less aromatic rings.

The semiconductor layer 115 supports a channel region 120 when the OFET 100 is active. One skilled in the art would understand that generally, the channel region 120 is located in semiconductor layer 115 near the gate structure 140. The thickness 122 of the semiconductor layer 115 can be varied to provide channel regions 120 of different sizes. For instance, the semiconductor layer 115 can have a single layer of organic semiconductor molecules or multiple layers. Consequently, the semiconductor layer's thickness 122 can be about 10 Angstroms or more. In some preferred embodiments, the semiconductor layer 115 has a thickness 122 between about 50 and about 1000 Angstroms. In certain embodiments, a thickness 122 of less than about 500 Angstroms is preferred because the carriers are confined mostly in a channel region 120 that is within 50 Angstroms of the surface 122 of the semiconductor layer 115 nearest to the gate structure 140.

Improved moisture resistance, through the use of fluorinated organic semiconductor molecules in the semiconductor layer 115, result in the channel region 120 having higher conductivity in humid enviroments. As an example, the channel region 120 can have a conductivity in an environment having a relative humidity of about 80 percent that is at least about 70 percent of the conductivity of the semiconductor layer 115 in a substantially zero-humidity environment.

The OFET 100 can further include source and drain electrodes 128, 130 on the top surface 110, with a portion 132 of the semiconductor layer 115 being between the source and drain electrode 128, 130. In preferred embodiments, the source and drain electrodes 128, 130 are made of metal, such as silver, platinum or gold, or of conductive organic polymer. A gap 135 between the source and drain electrodes 128, 130 can range from between about 1 and about 400 microns. In some OFETs 100, a large gap 135 of between about 200 and 300 microns is used, while in other OFETs 100, a small gap 135 of between about 4 and about 12 microns is used. OFETs having a small gap, made via photolithography, advantageously have higher switching speeds and current output. Alternatively, OFETs having a large gap can be more easily made than small-gap OFET by using shadow mask or print technology.

The substrate 105 of the OFET 100 can further include a gate structure 140 that includes a gate electrode 145 and a gate insulator 150 interposed between the gate electrode 145 and the source and drain electrodes 128, 130. The gate electrode 145 can be made of similar materials used for the source and drain electrodes, 128, 130, such as gold. The gate insulator 150 can be composed of any number of dielectric materials including silicon oxide or aluminum oxide.

FIG. 1 illustrates a particular configuration of the OFET 100 that is known by those skilled in the art as a top contact OFET. Such a configuration is desirable because it facilitates the formation of electrical contacts with the source and drain electrodes 128, 130. In such a configuration, at least a portion 155 of the semiconductor layer 115 is interposed between the substrate 105 and the source and drain electrodes 128, 130.

Figure 2:
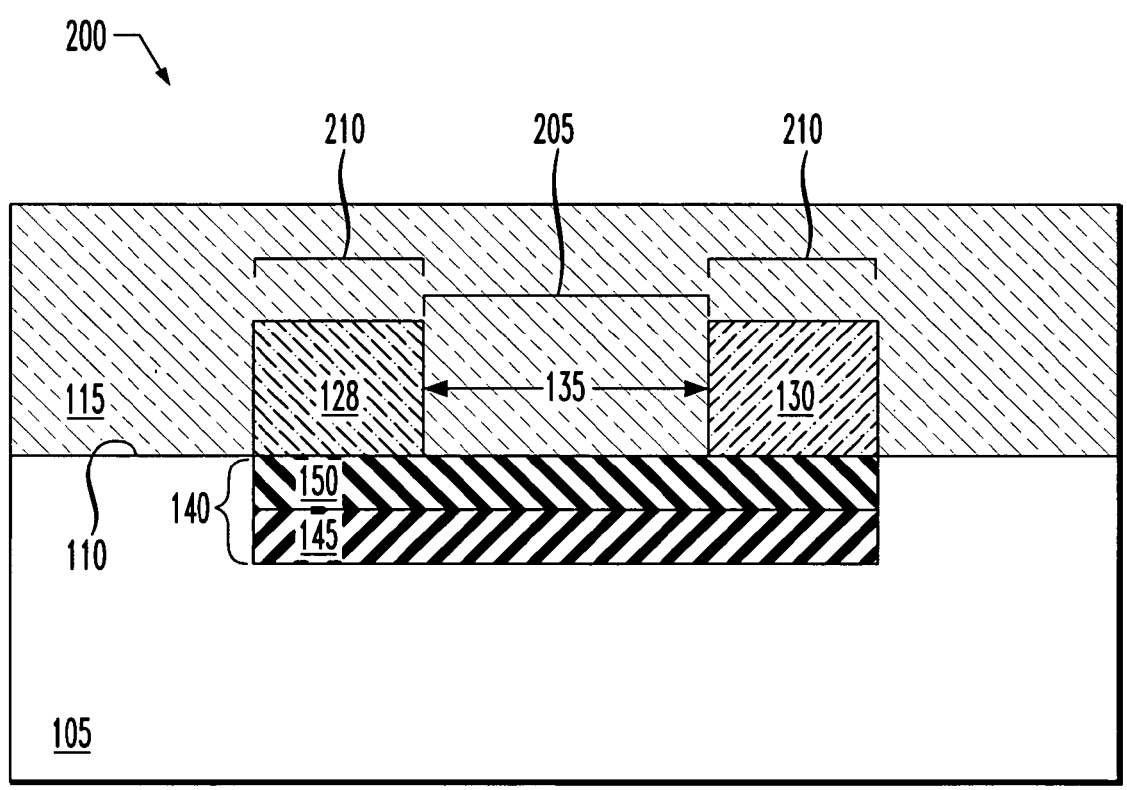
FIG. 2 illustrates detailed sectional view of a bottom contact organic field effect transistor embodying the principles of the present invention.

Turning now to FIG. 2, a bottom contact OFET 200 is illustrated. The same reference number as used in FIG. 1 are used to illustrate similar structures. A bottom contact OFET 200 configuration is advantageous when a small gap 135 between the source and drain electrodes 128, 130 is desired. This follows because a wider variety of methods can be used to formed the source and drain electrodes 128, 130, without the concern of degrading the organic semiconductor molecules of the semiconductor layer 115. There is a decreased risk of degradation because the organic semiconductor molecules of the semiconductor layer 115 are deposited after the source and drain electrodes 128, 130 are formed. In such a configuration, at least a portion 205 of the semiconductor layer 115 is interposed between the source and drain electrodes 128, 130. In some embodiments, another portion 210 of the semiconductor layer 115 covers the source and drain electrodes 128, 130.

Figure 3:
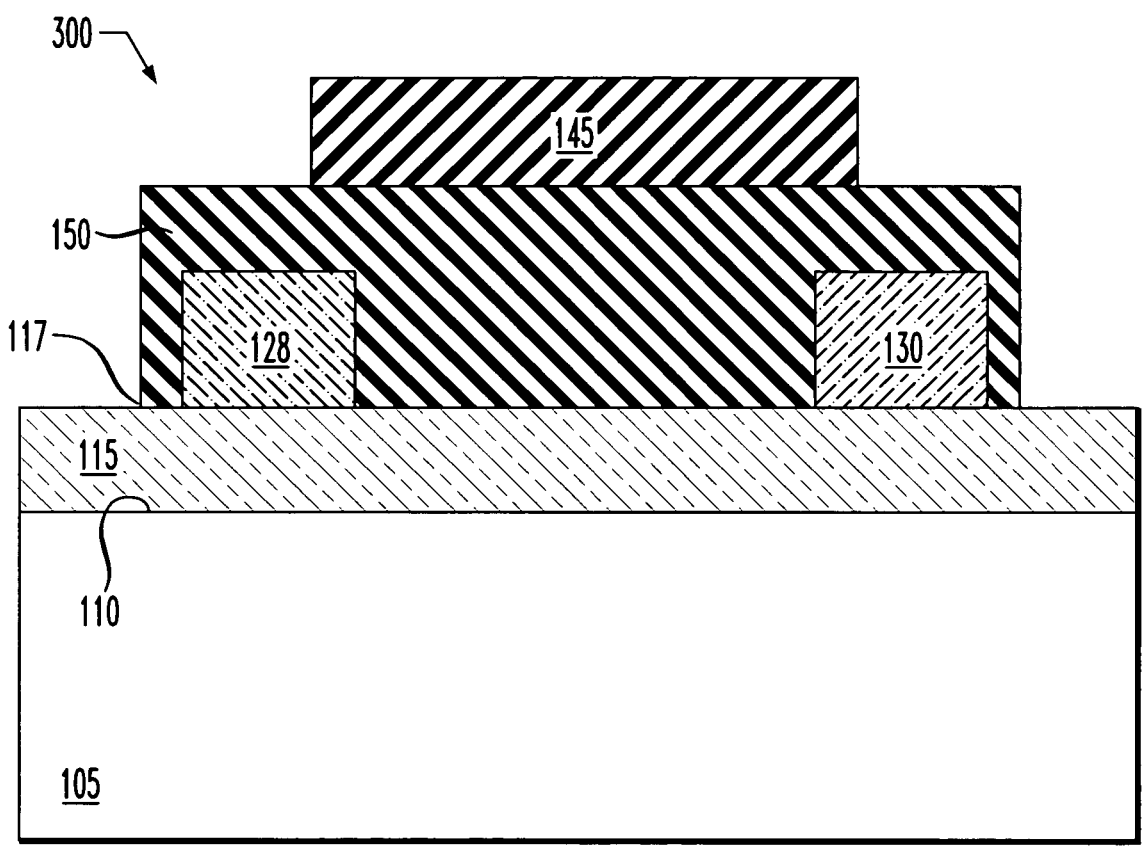
FIG. 3 illustrates detailed sectional view of a alterative organic field effect transistor embodying the principles of the present invention.

Turning now to FIG. 3, another configuration for the OFET device 300 of the present invention is illustrated. The same reference numbers as used in FIG. 1 are used to illustrate similar structures. Here, the semiconductor layer 115 is on the top surface 110 of the substrate 105 with the source and drain electrodes 128, 130 on the top surface of the 117 semiconductor layer 115. The gate insulating layer 150 and gate electrode 145 are over the semiconductor layer 115 and between the source and drain electrodes 128, 130.

Figure 4A:
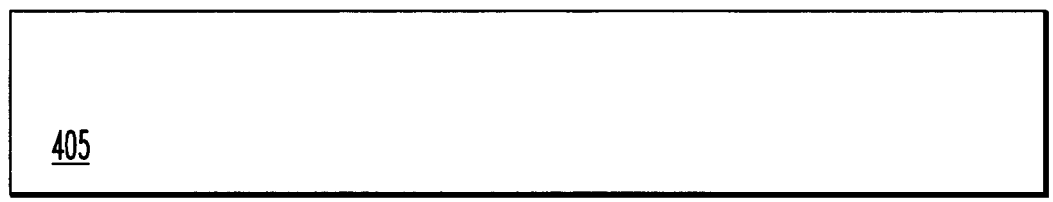
FIGS. 4A to 4F schematically illustrate detailed sectional views of a method of manufacturing a organic field effect transistor at selected stages of manufacture.
Figure 4B:
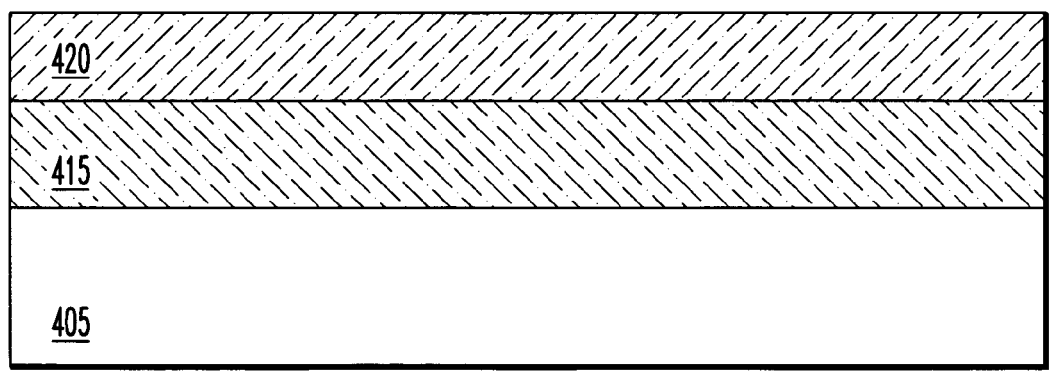

FIGS. 4A to 4F illustrate selected steps in an exemplary method of the present invention to form an OFET device 400. The OFET 400 is configured to function as a p-type semiconductor. Turning first to FIG. 4A, the method includes providing a substrate 405 comprising, for example, polyimide or other materials as described above. FIG. 4B shows the OFET 400 after forming a gate structure 410, comprising a gate electrode 415 and a gate insulator 420 over the substrate 405.

The gate electrode 415 can comprise metals such as gold, silver, platinum, and palladium. These materials can be deposited by conventional techniques like vacuum deposition, thermal evaporation or electron beam evaporation, followed by patterning via conventional lithographic processes to define the gate's structure. Alternatively, the gate electrode 415 can be made of conducting polymers, such as polyaniline or polythiophene, that can be doped to increase conductivity, or conductive ink, comprised of graphite and conducting polymers. Conventional techniques, such as ink jet printing, screen printing, or molding, can be used to form the gate electrode 415.

The gate insulator 420 can be formed by depositing an inorganic layer, such as silicon oxide or aluminum oxide sputtered over the substrate 405, and preferably on the gate electrode 415. Alternatively, the gate insulator 420 can be formed by spin-coating insulating organic polymers or organic polymer/inorganic composites, or by chemical vapor deposition of monomer or organic polymers, such as poly-para-xylylenes like parylene, on the gate electrode 415. As an example, polymers such as polyimide or polymethylmethacrylate can be deposited alone or in combination with titanium nanoparticles that serve to increase the dielectric constant of the gate insulator 420. See e.g., U.S. patent application Ser. No. 10/700,651, by Howard E. Katz et al., filed Nov. 4, 2003, incorporated herein in its entirety.

Figure 4C:
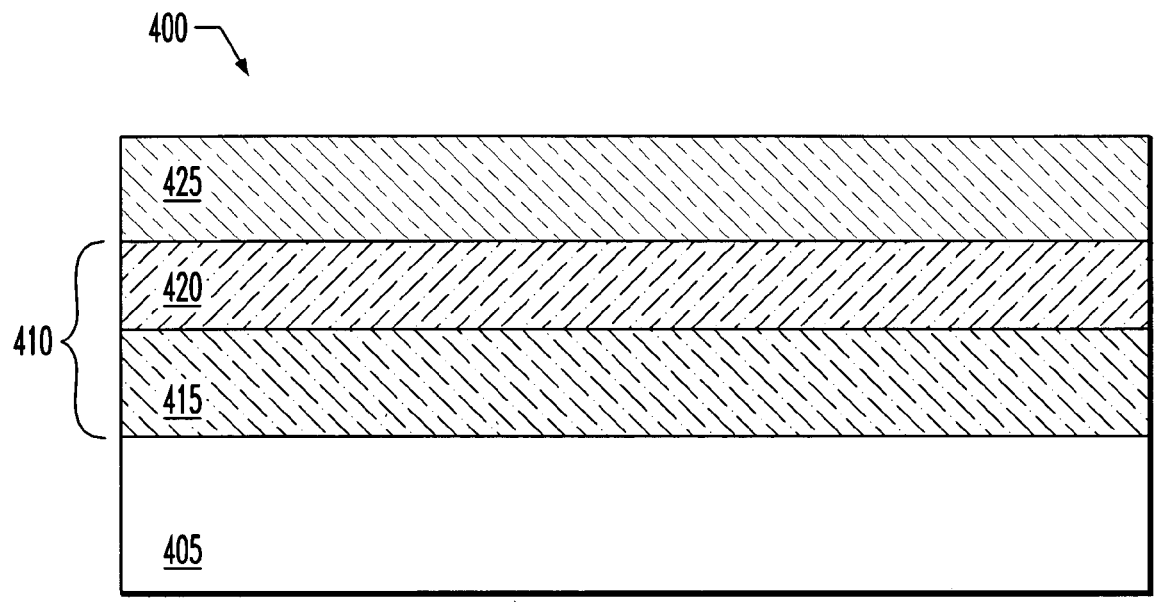
Figure 4D:
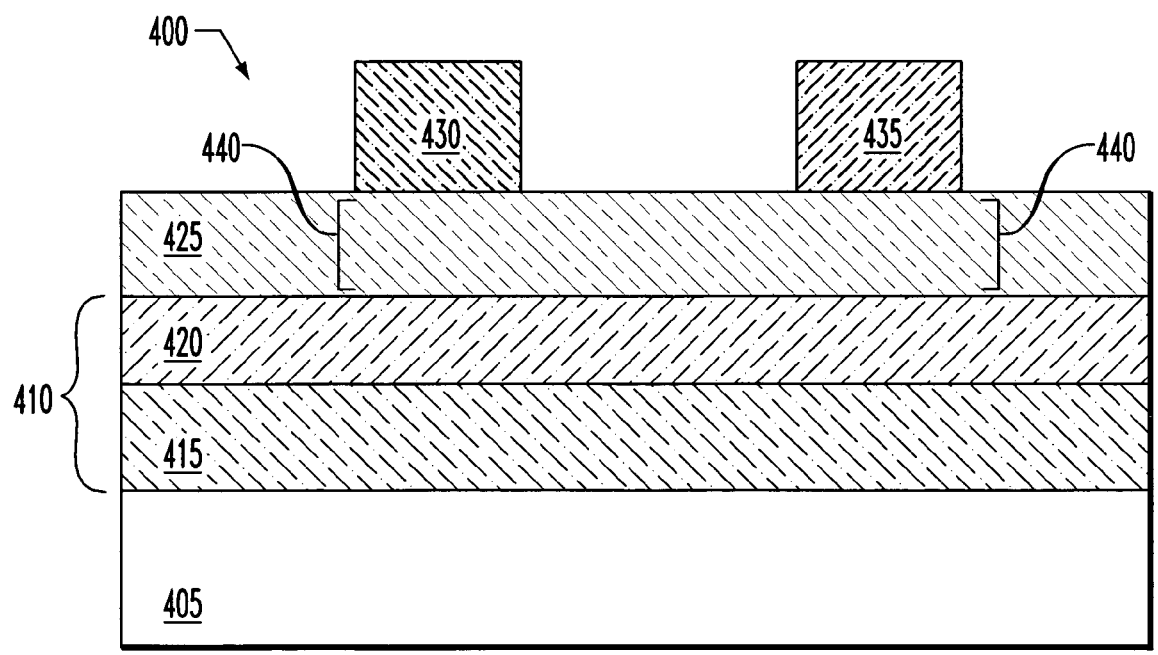

There are a number of processes by which a semiconductor layer of the present invention can be formed over the substrate 405. For instance, the manufacture of a top contact OFET 400 can include steps illustrated in FIGS. 4C and 4D. As illustrated in FIG. 4C, the semiconductor layer 425 is formed over the substrate 405, and preferably on the gate insulator 420. Then, as shown in FIG. 4D, source and drain electrodes 430, 435 are formed over the gate 410 and on the semiconductor layer 425.

Preferably the semiconductor layer 425 is formed between the source and drain electrodes 430, 435. In such OFETs 400, at least a portion 440 of the semiconductor layer 425 can be interposed between the source and drain electrodes 430, 435 and the substrate 405. Of course, the source and drain electrodes 430, 435 can be comprised of the same or different materials, and formed using the similar or different processes as described above for the gate electrode 415.

Figure 4E:
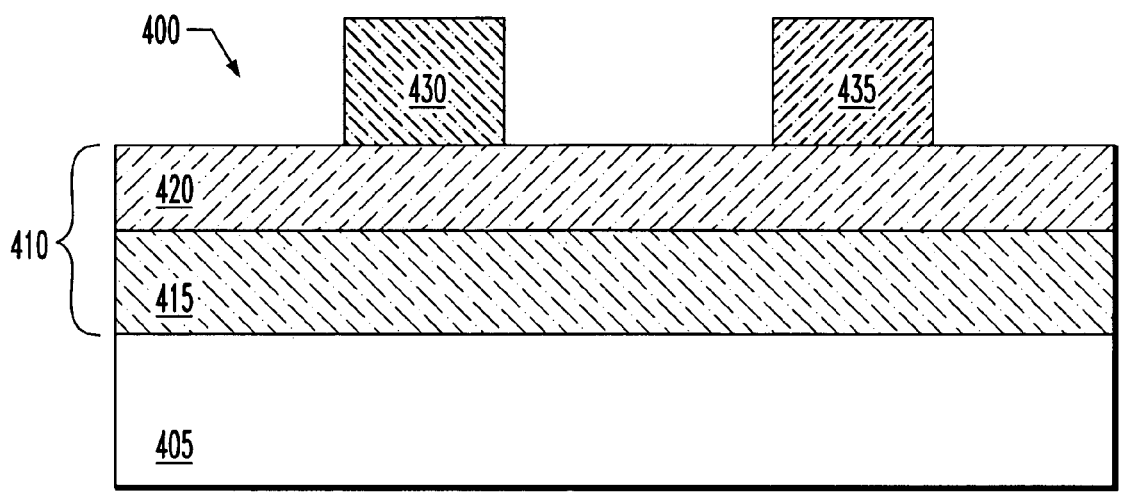
Figure 4F:
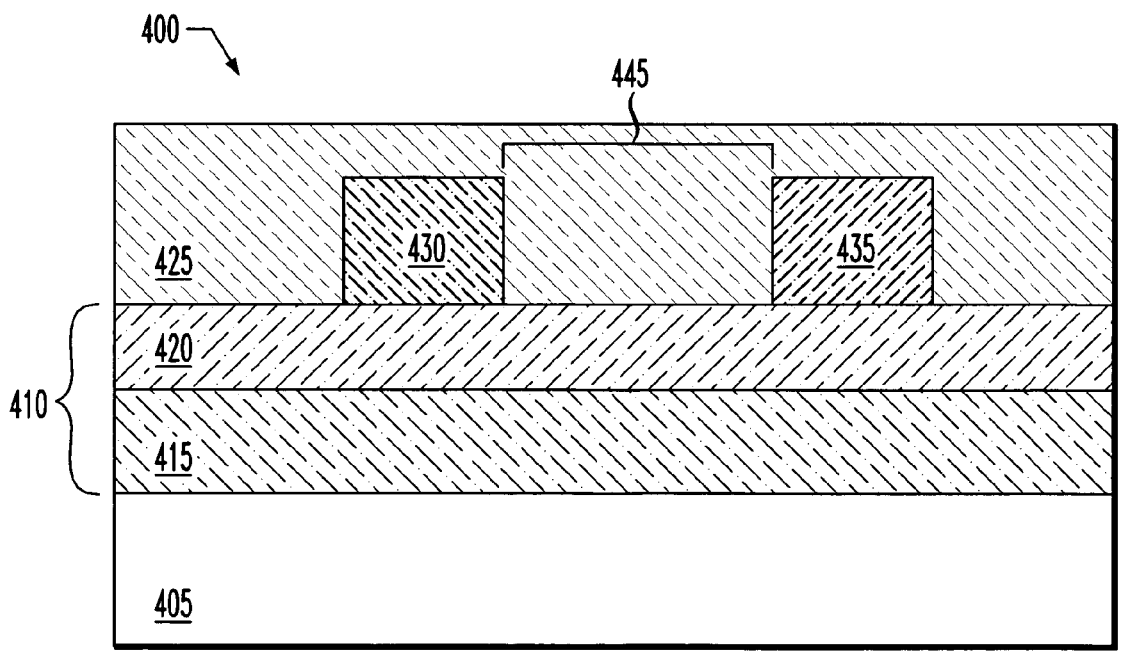

Alternatively, the sequence illustrated in FIGS. 4E and 4F may be used to manufacture a bottom contact OFET 400. Source and drain electrodes 430, 435 are formed over the substrate 405, and preferably on the gate insulator 420, of the partially completed device in FIG. 4B, to yield the OFET structure 400 in FIG. 4E. Then, a semiconductor layer 425 is formed over the substrate 405 to produce the OFET structure 400 shown in FIG. 4F. In such OFETs 400, at least a portion 445 of the semiconductor layer 425 is interposed between the source electrode 430 and the drain electrodes 435. In some embodiments, as shown in FIG. 4F, the semiconductor layer 425 covers the source and drain electrodes 430, 435.

The semiconductor layer 425 can be formed using any number of conventional techniques. For instance, when the organic semiconducting molecules of the semiconductor layer 425 have a molecular weight of 2000 gram/mole or less, vacuum sublimation can be used. Vacuum sublimation is advantageous because this promotes the formation of a uniform crystalline thin film of semiconducting molecules with a high degree of reproducibility. Of course, other procedures such as spin-coating or dip-coating can be used to form the semiconductor layer 425.

Although the present invention has been described in detail, those of ordinary skill in the art should understand that they can make various changes, substitutions and alterations herein without departing from the scope of the invention.

What is claimed is:

1. An organic field effect transistor (OFET), comprising, a substrate having a top surface; and
a semiconductor layer located over said top surface, said semiconductor layer comprising organic semiconductor molecules,
wherein each of said organic semiconductor molecules includes a core having conjugated pi bonds, a fluorinated alkyl group, and an alkyl spacer group having a chain of two or more carbon atoms,
wherein one end of said chain is bonded to said fluorinated alkyl group and another end of said chain is bonded to said core and substituents coupled to said carbon atoms have an electronegativity of less than about 4; and
wherein said OFET is configured to function as a p-type OFET.

2. The p-type OFET of claim 1, wherein said electronegativity is less than about 3.5.

3. The p-type OFET of claim 1, wherein said electronegativity is about 3 or more.

4. The p-type OFET of claim 1, wherein said chain has between 2 and 18 carbon atoms.

5. The p-type OFET of claim 1, wherein said core has ten or less aromatic rings.

6. The p-type OFET of claim 5, wherein said aromatic rings are thiophene rings.

7. The p-type OFET of claim 1, wherein each of said organic semiconductor molecules has a molecular weight of less than or equal to 2000 grams/mole.

8. The p-type OFET of claim 1, wherein said core has between ten and one-hundred aromatic rings and said fluorinated alkyl groups and said spacer groups are substituted on every or every other of said aromatic rings.

9. The p-type OFET of claim 1, further including source and drain electrodes on said top surface, wherein said source and drain electrodes comprise gold.

10. The p-type OFET of claim 9, wherein said substrate further including a gate electrode and a gate insulator interposed between said gate and said source and drain electrodes.

11. The p-type OFET of claim 10, wherein at least a portion of said semiconductor layer is interposed between said substrate and said source and drain electrodes.

12. The p-type OFET of claim 10, wherein at least a portion of said semiconductor Layer covers said source electrode and said drain electrode.

13. The p-type OFET of claim 1, wherein a channel region in said semiconductor layer has a conductivity in an environment having a relative humidity of about 80 percent that is at least about 70 percent of the conductivity of said channel in a substantially zero-humidity environment.

* * * * *